United States Patent
Hurter et al.

[11] Patent Number: 5,835,413
[45] Date of Patent: Nov. 10, 1998

[54] METHOD FOR IMPROVED DATA RETENTION IN A NONVOLATILE WRITEABLE MEMORY BY SENSING AND REPROGRAMMING CELL VOLTAGE LEVELS

[75] Inventors: Andrew J. Hurter, Rocklin; Edward M. Doller, El Dorado Hills, both of Calif.

[73] Assignee: Intel Corporation, Santa Clara, Calif.

[21] Appl. No.: 771,445

[22] Filed: Dec. 20, 1996

[51] Int. Cl.⁶ .......................... G11C 16/00; G11C 14/00
[52] U.S. Cl. .................. 365/185.24; 365/185.18; 365/189.11; 365/233.5
[58] Field of Search .................... 365/185.24, 185.01, 365/185.03, 185.12, 185.18, 185.22, 185.25, 185.27, 185.29, 185.33, 189.11, 233.5, 203, 204, 222

[56] References Cited

U.S. PATENT DOCUMENTS

| | | |
|---|---|---|
| 4,460,982 | 7/1984 | Gee et al. . |
| 4,703,196 | 10/1987 | Arakawa .................................. 327/126 |
| 5,065,364 | 11/1991 | Atwood et al. . |
| 5,119,330 | 6/1992 | Tanagawa ........................... 365/185.03 |
| 5,122,985 | 6/1992 | Santin ................................ 365/185.19 |
| 5,239,505 | 8/1993 | Fazio et al. . |
| 5,250,914 | 10/1993 | Kondo ..................................... 331/111 |
| 5,327,383 | 7/1994 | Merchant et al. . |
| 5,341,334 | 8/1994 | Markiyama ........................ 365/189.11 |
| 5,347,489 | 9/1994 | Merchant et al. . |
| 5,408,429 | 4/1995 | Sawada .............................. 365/185.12 |
| 5,428,580 | 6/1995 | Kawashima et al. ................ 365/233.5 |
| 5,440,505 | 8/1995 | Fazio et al. . |
| 5,479,172 | 12/1995 | Smith et al. .............................. 342/51 |
| 5,493,141 | 2/1996 | Riccó et al. ............................ 257/321 |
| 5,537,357 | 7/1996 | Merchant et al. . |
| 5,608,406 | 3/1997 | Eberth et al. ............................. 342/51 |
| 5,675,537 | 10/1997 | Biu et al. ........................... 365/185.22 |
| 5,703,506 | 12/1997 | Shook et al. .............................. 327/87 |
| 5,717,632 | 2/1998 | Richart et al. ..................... 365/185.01 |

*Primary Examiner*—Tod R. Swann
*Assistant Examiner*—J. Peikari
*Attorney, Agent, or Firm*—Blakely, Sokoloff, Taylor & Zafman

[57] ABSTRACT

A method and apparatus improves data retention in a non-volatile writeable memory. A first group of memory cells is identified as having a stored charge over a first threshold. A subset of the first group of memory cells having a stored charge less than a second threshold is determined. The subset of the memory cells is programmed until each of the memory cells of the subset has a stored charge over the second threshold.

17 Claims, 7 Drawing Sheets

METHOD FOR IMPROVED DATA RETENTION IN A NONVOLATILE WRITEABLE MEMORY BY SENSING AND REPROGRAMMING CELL VOLTAGE LEVELS

FIELD OF THE INVENTION

The present invention relates to memory devices. More particularly, this invention relates to data retention in a nonvolatile writeable memory.

BACKGROUND OF THE INVENTION

Many computing systems, such as personal computers, automotive and airplane control, cellular phones, digital cameras, and hand-held communication devices, use non-volatile writeable memories to store either data or code, or both. Such nonvolatile writeable memories include Electrically Erasable Programmable Read-Only Memories ("EEPROMs") and flash Erasable and Electrically Programmable Read-Only Memories ("flash EPROMs" or "flash memories").

Non-volatility is advantageous for allowing the computing system to retain its data and code when power is removed from the computing system. Thus, if the system is turned off or if there is a power failure, there is no loss of code or data.

Writability, or programmability, enables the computing system to be reprogrammed. This is useful, for example, for upgrading the system, or for correcting bugs in the code.

FIG. 1 is a block diagram of a prior art nonvolatile writeable memory device 20. Memory device 20 stores data using nonvolatile memory cells within memory array 22. The threshold voltages of the nonvolatile memory cells can be altered during programming, thus permitting storage of analog voltage levels, as is well known in the art. Memory array 22 may include any type of memory cell with programmable threshold voltages, such as memory cells with trapping dielectric or floating gates. In one embodiment, memory array 22 is comprised of flash memory cells.

Referring to FIG. 1, Vpp is the erase/program power supply for memory device 20. In the absence of a high voltage level on the memory cells, memory device 20 acts as a read only memory. The data stored at an address indicated by address lines 24 is read from memory array 22 and is output to the external user via data lines 26.

X decoder 28 selects the appropriate row within memory array 22 in response to address signals applied to address lines 24. For this reason, X decoder 28 is also called row decoder 28. Similarly, Y decoder 30 selects the appropriate column within memory array 20 in response to address signals from address lines 24. Because of its function, Y decoder 30 is also called column decoder 30.

Data output from memory array 22 is coupled to Y decoder 30, which passes the data on to sensing circuitry 32. Sensing circuitry 32 determines the state of data presented to it using reference cell array 34. Sensing circuitry 32 then passes the results of its analysis back to Y decoder 30.

In one embodiment of memory device 20, control engine 36 controls the erasure and programming of memory array 22. In another embodiment, control engine 36 also controls the programming of multilevel cells. A multilevel cells is a cell that can store three or more charge states, as is well-known in the prior art. In one embodiment, control engine 36 includes a processor or microcontroller that is controlled by microcode stored in on-chip memory. However, the particular implementation of control engine 36 does not affect the present method of programming memory cells.

Control engine 36 manages memory array 22 via control of row decoder 28, column decoder 30, sensing circuitry 32, reference cell array 34 and voltage switch 38. Voltage switch 38 controls the various voltage levels necessary to read, program and erase memory array 22. Vcc is the device power supply and Vss is ground. Vpp is the program/erase voltage used to program or erase data stored within memory array 22. Vpp may be externally supplied or internally generated.

User commands for reading, erasure, and programming are communicated to control engine 36 via command interface 40. The external user issues commands to command interface 40 via three control pins: output enable OEB, write enable WEB and chip enable CEB.

FIG. 2 is a diagram showing a prior art memory cell of the memory array 22 in terms of a threshold voltage, Vt. The state of the memory cell may be defined in terms of the memory cell threshold voltage level or the drain current. Memory cell threshold voltage Vt, and drain current Id are approximately related to each other by the expression:

$$Id \; \alpha \; Gm \times (Vg-Vt) \; for \; Vd > Vg-Vt, \; where$$

Gm is the transconductance of the memory cell;
Vg is the memory cell gate voltage;
Vd is the memory cell drain voltage; and
Vt is the memory cell threshold voltage.

The memory cell has associated with it, a programmed-reference level and an erased-reference level. If the charge stored on the floating gate of the memory cell corresponds to a Vt below the erased reference level, then the memory cell is defined to be in an "erased" state. If the charge stored on the floating gate of the memory cell corresponds to a Vt above the programmed-reference level, then the memory cell is defined to be in a "programmed" state.

A read reference level is typically used to read from the memory cell. If the Vt of the memory cell is higher than the read reference level, then the read indicates the memory cell is in a "programmed" state. If the Vt is below the read reference level, then the read indicates the memory cell is in an "erased" state.

Some nonvolatile writeable memories, such as flash EPROMs, can be re-programmed multiple times. However, after repeated programming, the memory may lose its ability to maintain charge adequately. The memory may then be susceptible to charge loss errors.

Charge loss may also occur from stresses to the memory due to operating the memory at elevated temperatures or voltages for extended periods of time. Thus, a cell of the memory that was originally stored as a high Vt, or programmed, state may lose charge such that it is later read back in a low Vt, or erased, state.

SUMMARY OF THE INVENTION

A method and apparatus improves data retention in a nonvolatile writeable memory. A first group of memory cells is identified as having a stored charge over a first threshold. A subset of the first group of memory cells having a stored charge less than a second threshold is determined. The subset of the memory cells is programmed until each of the memory cells of the subset has a stored charge over the second threshold.

These and other advantages of the present invention are fully described in the following detailed description.

DETAILED DESCRIPTION

A method and apparatus that improves data retention in a nonvolatile writeable memory is described. The invention identifies memory cells having a stored charge within an intermediate region lying between a programmed state and an erased state. These memory cells include memory cells that were in the programmed state originally, but due to charge loss, now lie in the intermediate region. These memory cells are programmed to raise their stored charge up to the programmed state.

Figure 1:
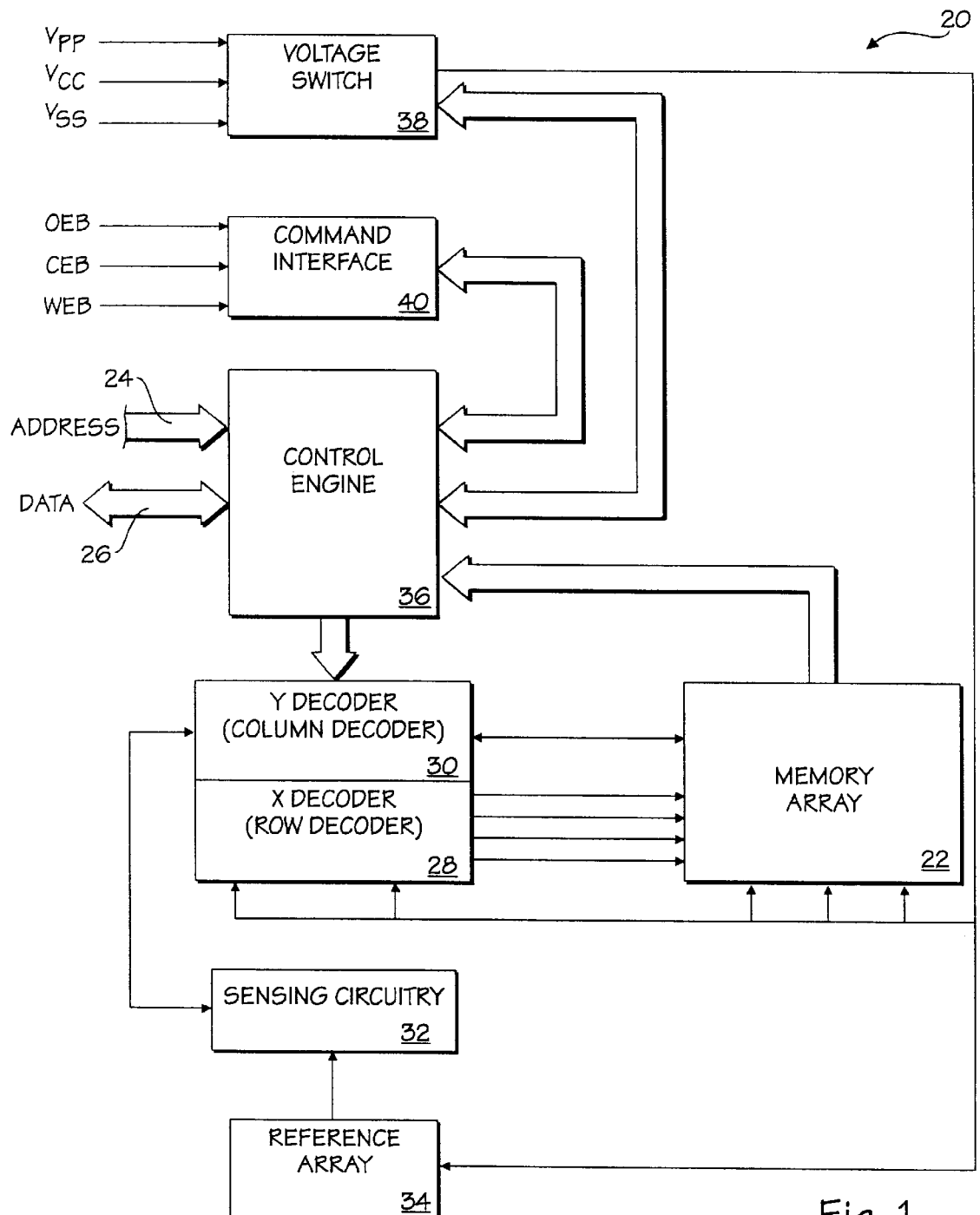
FIG. 1 is a block diagram of a prior art nonvolatile writeable memory device 20.
Figure 2:
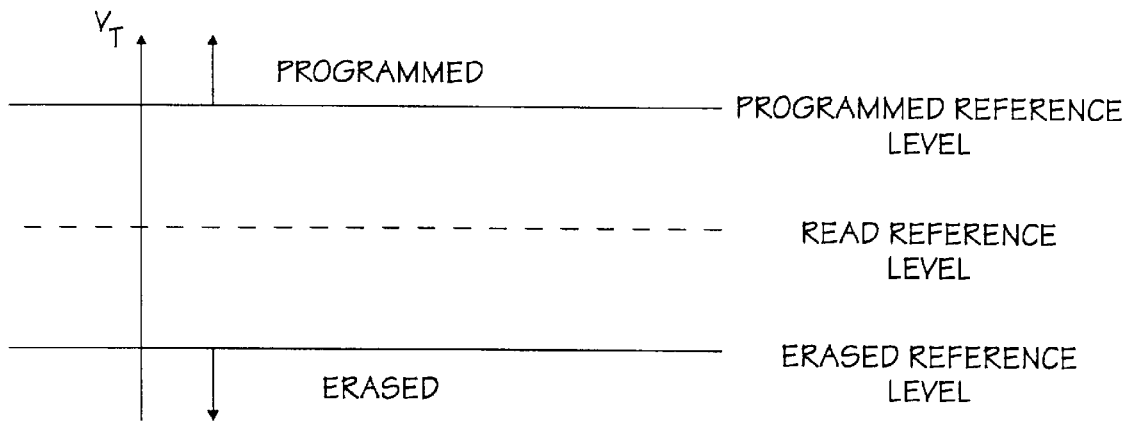
FIG. 2 is a diagram showing a prior art memory cell of the memory array 22 in terms of a threshold voltage, Vt.
Figure 3:
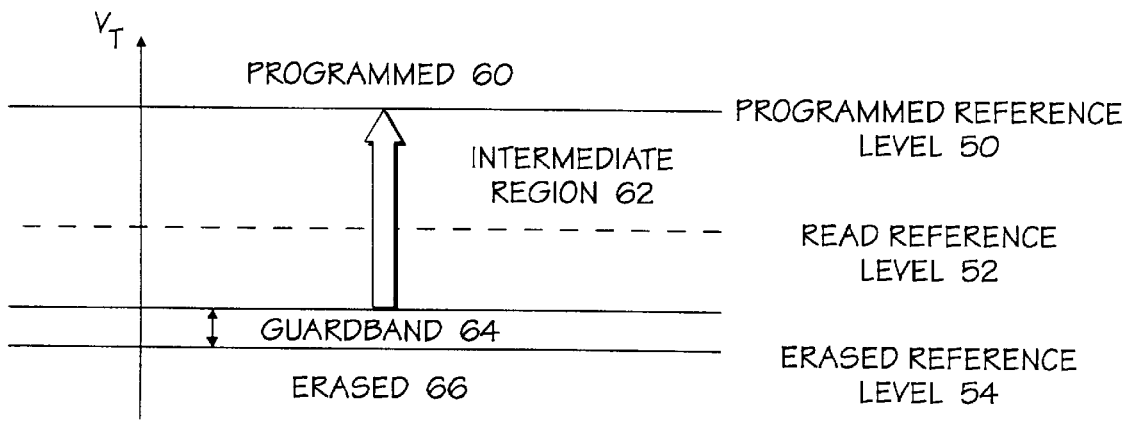
FIG. 3 is a diagram showing the different charge regions of a memory cell according to one embodiment of the present invention.

FIG. 3 is a diagram showing the different charge regions of a memory cell according to one embodiment of the present invention. If a memory cell has a Vt above a programmed reference level 50, then the memory cell is in a programmed state 60. If the memory cell has a Vt below the erased reference level 54, then the memory cell is in an erased state 66. The region between the programmed reference level 50 and the erased reference level 54 is comprised of an intermediate region 62 and a guardband region 64. The read reference level typically resides within the intermediate region 62.

The invention searches for memory cells having a Vt within the intermediate region, as will be explained in further detail. Once these memory cells have been identified, then each of these memory cells is programmed to raise the Vt of that memory cell up to the programmed reference level. In one embodiment, the programmed reference level is approximately 5.3 V, and the erased reference level is approximately 3.1 V.

Figure 4:
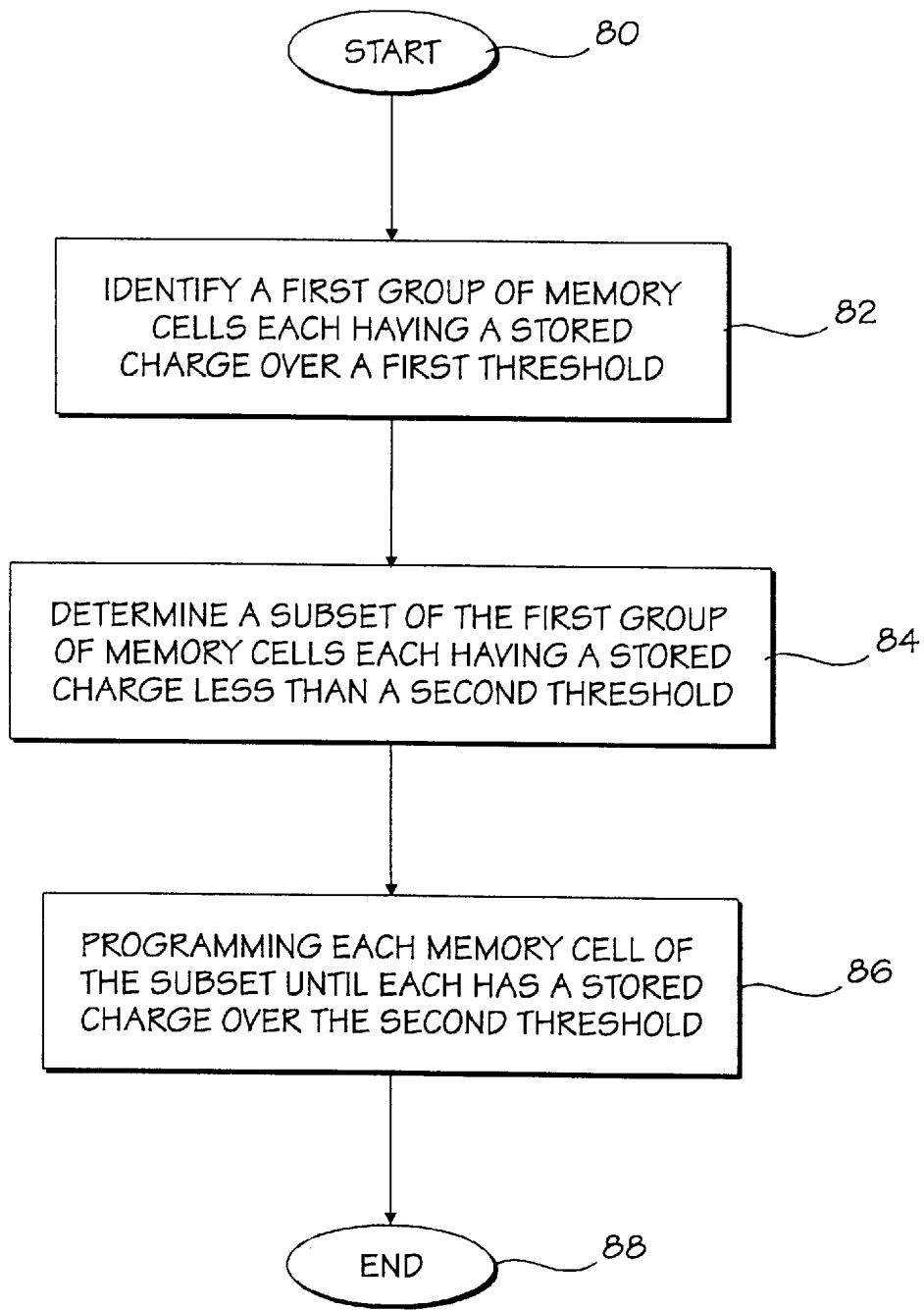
FIG. 4 shows a flow chart illustrating the steps taken by the memory in improving data retention.

FIG. 4 shows a flow chart illustrating the steps taken by the memory in improving data retention. The flow chart starts at a block 80, from which it continues at block 82. At block 82, a first group of memory cells each having a stored charge over a first threshold is identified. Operation continues at block 84, at which a subset of the first group of memory cells is determined, wherein the subset of the first group of memory cells has a stored charge less than a second threshold. At block 86, each of the memory cells of the subset is programmed until each memory cell has a stored charge over the second threshold. Operation terminates at block 88.

Alternatively, instead of checking an entire group for memory cells having a charge state within the intermediate region and programming the identified memory cells, the process may be performed successively on each memory cell to determine whether that particular memory cell needs to be programmed before checking the next memory cell.

Figure 5:
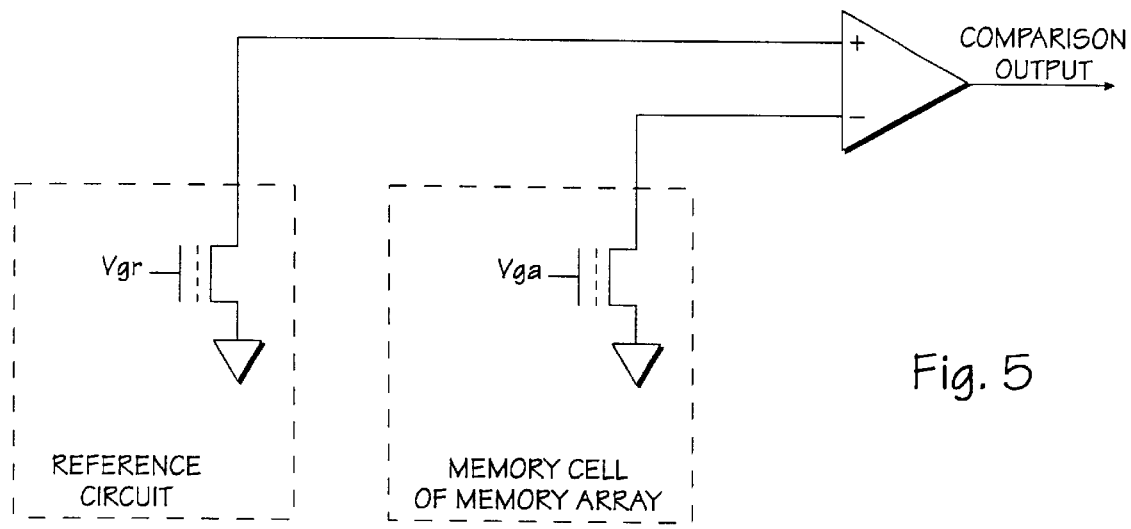
FIG. 5 shows a representative sense amp which is used to determine the Vt of a memory cell.

FIG. 5 shows a representative sense amp which is used to determine the Vt of a memory cell. Each memory cell of the memory array is compared against a reference cell to determine whether the Vt of the memory cell is higher or lower than that of the reference cell, as is well-known in the prior art. In a first embodiment, a "data retention" reference cell is created corresponding to the erased reference level of the memory cell plus a guardband 64. This data retention reference level is compared against each memory cell to determine whether any of the memory cells need to be programmed up to the programmed state 60.

In one embodiment, a guardband of approximately 400 mV was experimentally determined to be a sufficient buffer to prevent erased memory cells from erroneously being determined to be in the intermediate region yet still able to capture any "programmed" memory cells that have lost charge.

In another embodiment, either a read reference cell or an erased reference cell is used to emulate a new data retention reference cell.

Referring to FIG. 5, the gate voltage of the reference circuit Vgr can be modified from the gate voltage of the memory cell Vga in order to emulate a reference circuit corresponding to a different Vt by the formula:

For example, Vgr=Vga−guardband, for the erased reference cell. Thus, if Vga is 5.0 V and the guardband is 400 mV, then Vgr is 4.6 V.

Figure 6:
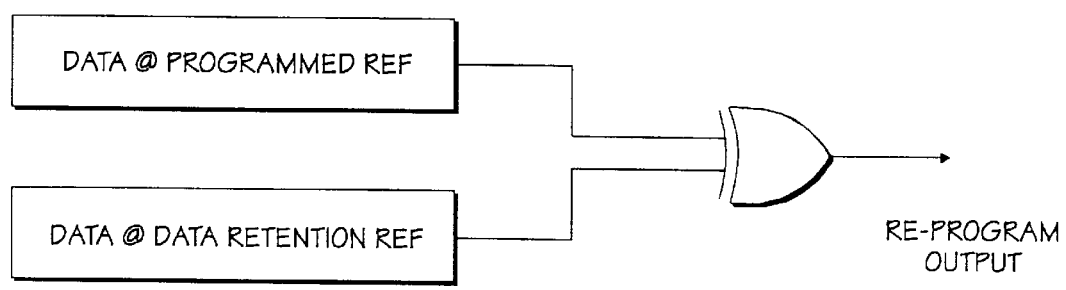
FIG. 6 shows the results of a read from a first group of memory cells at the programmed reference being compared with the results of a read from the same first group of memory cells at the data retention reference.

FIG. 6 shows the results of a read from a first group of memory cells at the programmed reference being compared with the results of a read from the same first group of memory cells at the data retention reference. In this case, the comparison is done via an XOR gate. Any differences between the two results indicate that at least one of the memory cells has lost charge. The indicated memory cell(s) is then programmed back up to the programmed reference level.

Figure 7:
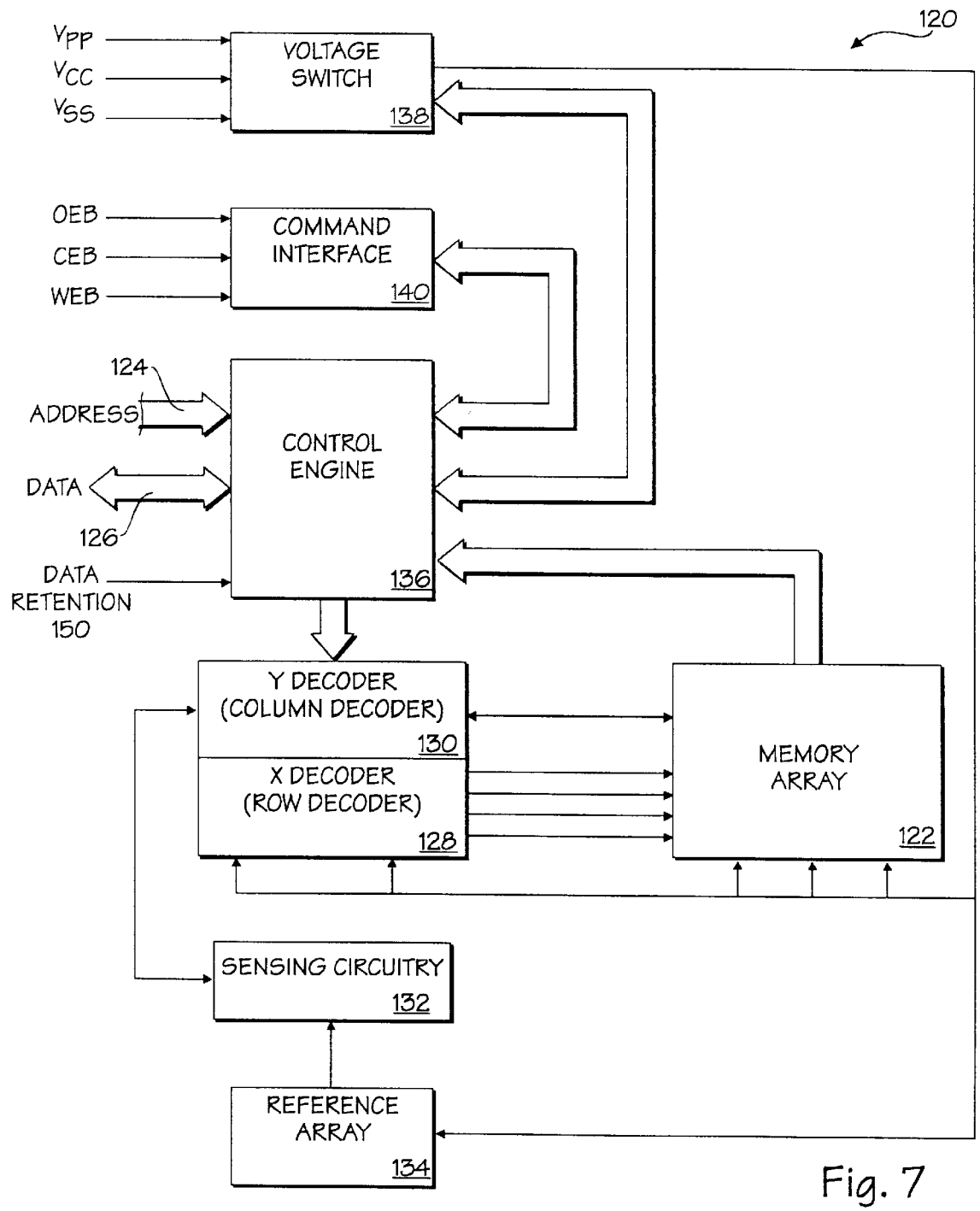
FIG. 7 illustrates a memory device having an external data retention pin.

FIG. 7 illustrates a memory device having an external data retention pin 150. When the data retention pin 150 is asserted then the memory performs a data retention operation. The memory device may, either in addition to or alternatively, allow a data retention command to be written to the command interface 140.

In response to the assertion of the data retention pin 150 or to a data retention command being written to the memory 120, the memory performs a data retention operation. In one embodiment, the data retention command selectively directs the memory to perform a data retention operation on either a block of the memory array or the entire memory array in a similar way that either a block or the entire memory array can be erased.

The invention may be applied to a multilevel cell memory. One implementation of a multilevel cell memory is described in U.S. Pat. No. 5,450,363, entitled "Gray Coding for a Multilevel Cell Memory System," by Christopherson et al., and issued to the common assignee of this application. Multilevel cell memories can be used in Dynamic Random Access Memory (DRAM) and various types of Read-Only Memory (ROM), such as an Erasable Programmable Read-Only Memory (EPROM), an Electrically Erasable Programmable Read-Only Memory (EEPROM), and flash Erasable Programmable Read-Only Memory (flash EPROM).

Figure 8:
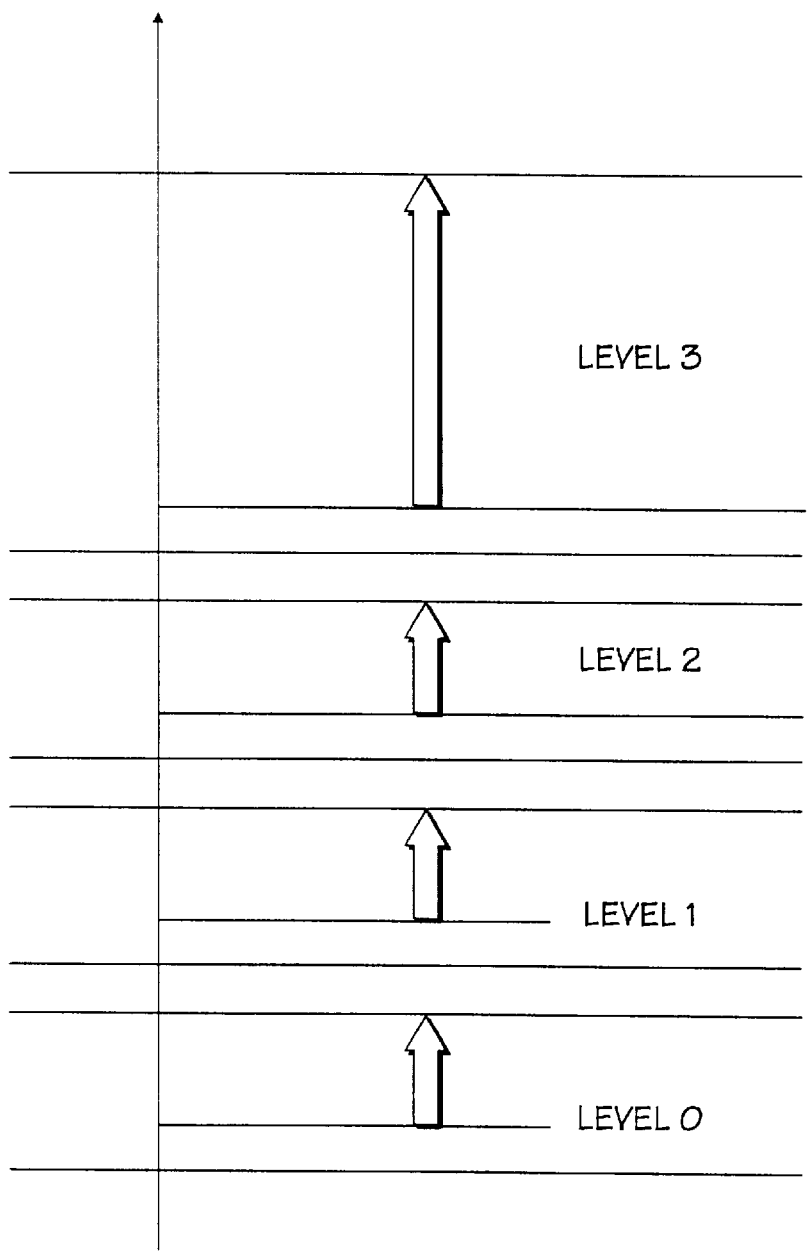
FIG. 8 shows a representation of a multilevel cell that employs the present invention.

In a multilevel cell memory, each memory cell is programmed so that it maintains a charge corresponding to one of the multilevel states. FIG. 8, for example, shows four possible multilevel charge states. The invention is used to raise the stored charge of a multilevel cell, when the charge is determined to be below an optimum level. However, in this case, the stored charge must be programmed so as not to enter the next higher state.

FIG. 8 shows a representation of a multilevel cell that employs the present invention. The representative multilevel cell has the capability of storing a charge in one of four charges states, from Level 0 to Level 3. A buffer region separates each of the charge states. Different reference levels can be used to search for a Vt within an intermediate region of each charge state, in order to raise the stored charge of the memory cell such that the Vt will correspond to the programmed region of the same charge state.

Figure 9:
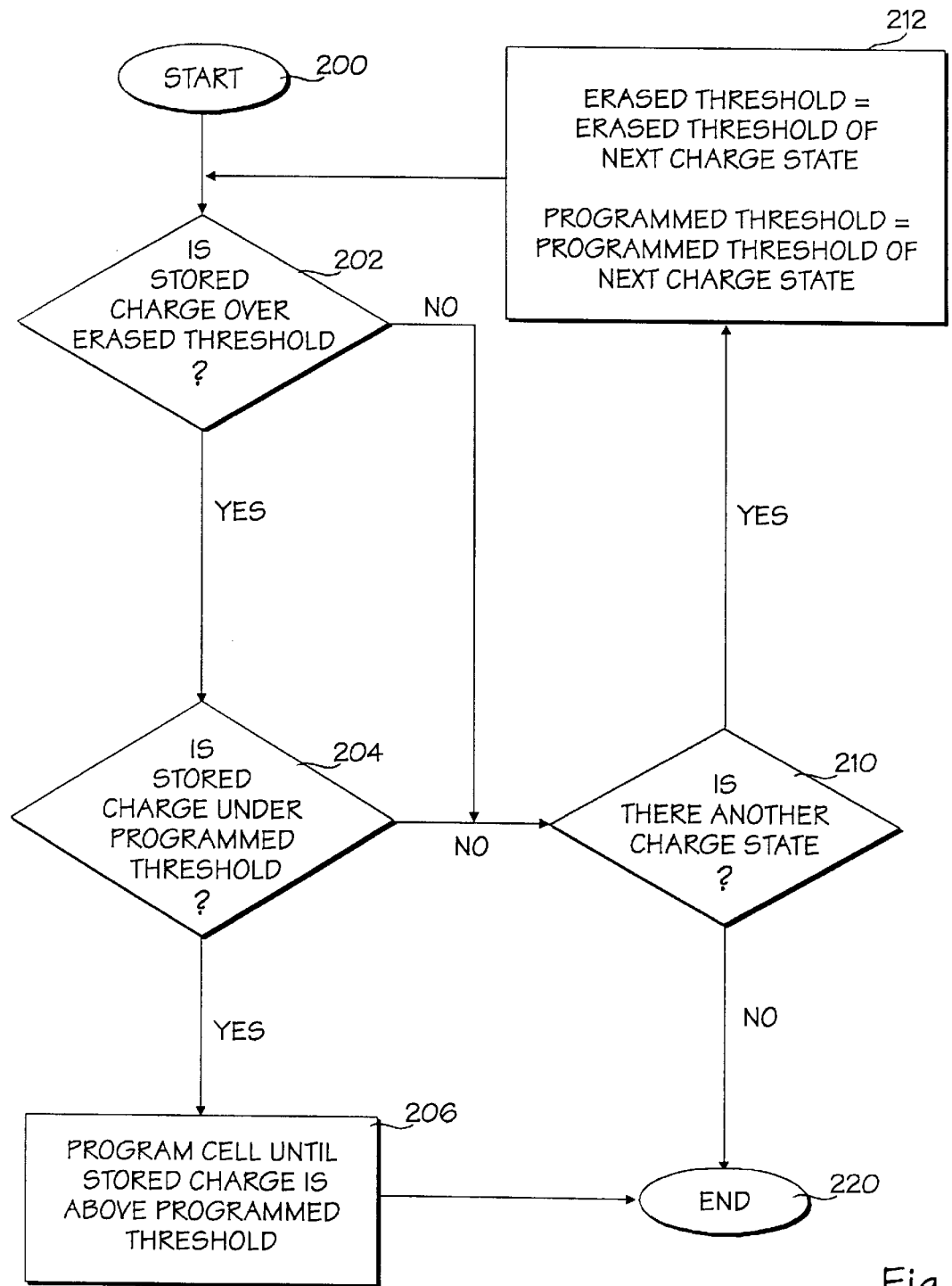
FIG. 9 shows a flow chart of the steps taken in extending the data retention procedure to a multilevel cell.

FIG. 9 shows a flow chart of the steps taken in extending the data retention procedure to a multilevel cell. The flowchart begins at block 200, from which the flow chart continues at block 202. At block 202, it is determined whether a memory cell has a stored charge over an erased threshold corresponding to a charge state of the multilevel cell. If the memory cell does have a stored charge over the erased threshold, then operation continues at block 204, at which it is determined whether the memory cell has a stored charge under a programmed threshold. If the memory cell has a stored charge under the programmed threshold, then operation continues at block 206, at which the memory cell is programmed until it has a stored charge above the programmed threshold. Operation will then terminate at block 220.

However, if at block 202, the stored charge is not over the erased threshold, or if at block 204, the stored charge is not under the programmed threshold, then operation continues at block 210. If there is another charge state then operation continues at block 212. If there is no other charge state then operation terminates at block 220.

At block 212, the erased threshold is set to the value of an erased threshold of the next charge state of the memory cell. Similarly, the programmed threshold is set to the value of a programmed threshold corresponding to the next charge state of the memory cell. In one embodiment, the flowchart of FIG. 9 will start with the lowest charge state and progressively check the next higher charge state until each of the charge states have been checked. In another embodiment, the flowchart starts with the highest charge state and progressively checks the next lower charge state until all charge states have been checked. In some cases, some charge states will not have to be checked based upon comparisons with the thresholds of previous charge states.

In one embodiment, each of the charge states includes a guardband voltage over the erased threshold of that charge state similar to that described with respect to FIG. 3. Cells having a Vt within a region of a charge state above the guardband voltage but below a programmed threshold are raised to the programmed threshold.

In the foregoing specification, the invention has been described with reference to specific exemplary embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of improving data retention within a nonvolatile writeable memory, the method comprising the steps of:
   (a) identifying a first group of memory cells each having a stored charge over a first threshold;
   (b) determining a subset of the first group of memory cells each having a stored charge less than a second threshold; and
   (c) programming each memory cell of the subset of the first group of memory cells until each of the memory cells of the subset has a stored charge over the second threshold.

2. The method of claim 1 wherein the steps (a)–(c) are performed responsive to a command written to the nonvolatile writeable memory.

3. The method of claim 1 wherein the steps (a)–(c) are performed responsive to a signal provided to a pin of the nonvolatile writeable memory.

4. The method of claim 1 wherein the first threshold corresponds to an erased-cell reference level plus a guardband level.

5. The method of claim 4 wherein the guardband level is within a range of 300 mV to 500 mV.

6. The method of claim 1 further comprising the steps of:
   (d) identifying a second group of memory cells each having a stored charge over a third threshold;
   (e) determining a second subset of the second group of memory cells each having a stored charge less than a fourth threshold, wherein the third threshold is above the second threshold, and wherein the fourth threshold is above the third threshold; and
   (f) programming each memory cell of the second subset of the second group of memory cells until each of the memory cells of the subset has a stored charge over the fourth threshold.

7. The method of claim 1 further comprising the steps of:
   (d) identifying a second group of memory cells each having a stored charge over a third threshold;
   (e) determining a second subset of the second group of memory cells each having a stored charge less than a fourth threshold, wherein the fourth threshold is below the first threshold, and wherein the third threshold is below the fourth threshold; and
   (f) programming each memory cell of the second subset of the second group of memory cells until each of the memory cells of the subset has a stored charge over the fourth threshold.

8. A method of improving data retention in a nonvolatile writeable memory having an erased-cell reference level and a programmed-cell reference level, the nonvolatile writeable memory having a plurality of memory cells, each of the memory cells being in an erased state when storing a charge below the erased-cell reference level, and each of the memory cells being in a programmed state when storing a charge above the programmed-cell reference level, the method comprising the steps of:
   (a) identifying a memory cell having a charge above the erased-cell reference level and below the programmed-cell reference level; and
   (b) programming the memory cell until the charge of the memory cell is above the programmed-cell reference level.

9. The method of claim 8 wherein the step (a) of identifying the memory cell having a charge above the erased-cell reference level and below the programmed-cell reference level identifies only memory cells above the erased-cell reference level plus a guardband level, and wherein the guardband level is between 300 mV to 500 mV.

10. A method of improving data retention in a nonvolatile writeable memory having an erased-cell reference level and a programmed-cell reference level, the nonvolatile writeable memory having a plurality of memory cells, each of the memory cells being in an erased state when storing a charge below the erased-cell reference level, and each of the memory cells being in a programmed state when storing a charge above the programmed-cell reference level, the method comprising the steps of:

(a) reading first data from a group of the memory cells using a reference voltage level corresponding to the programmed-cell reference level;

(b) reading second data from the group of the memory cells using a reference voltage level corresponding to the erased-cell reference level plus a guardband level;

(c) comparing the first data from the step (a) to the second data from the step (b);

(d) programming one or more of the group of the memory cells corresponding to a difference between the first data and the second data.

11. The method of claim 10 wherein the guardband level of the step (b) is between 300 mV to 500 mV.

12. The method of claim 10 wherein the step (b) is performed before the step (a).

13. A nonvolatile writeable memory comprising:

a pin for receiving a data retention signal causing the nonvolatile writeable memory to program memory cells that have a stored charge within an intermediate charge region, the intermediate charge region lying above an erased cell threshold and below a programmed cell threshold.

14. The nonvolatile writeable memory of claim 13 wherein a buffer region separates the erased cell threshold from the intermediate charge region.

15. The nonvolatile writeable memory of claim 13 further comprising:

a command register for receiving commands, the commands including a data retention command that causes the nonvolatile writeable memory to program memory cells that have a stored charge within the intermediate charge region.

16. A nonvolatile writeable memory comprising:

a memory array;

a command register coupled to receive commands, the commands including a data retention command for performing a data retention operation, the data retention operation comprising programming memory cells that have a stored charge within an intermediate charge region between an erased state and a programmed state; and memory array control circuitry for performing the data retention operation on the memory array in response to the data retention command.

17. The nonvolatile writeable memory of claim 16 wherein the nonvolatile writeable memory is a flash EPROM.

* * * * *